(12) United States Patent
Uezawa et al.

(10) Patent No.: US 9,564,591 B2
(45) Date of Patent: *Feb. 7, 2017

(54) METHOD FOR PRODUCING ORGANIC ELECTROLUMINESCENT ELEMENT HAVING LIGHT-EMITTING PATTERN

(71) Applicant: Konica Minolta, Inc., Tokyo (JP)

(72) Inventors: Kuniaki Uezawa, Hamura (JP); Yuuji Aritomi, Hachioji (JP)

(73) Assignee: KONICA MINOLTA, INC., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/888,310

(22) PCT Filed: May 2, 2014

(86) PCT No.: PCT/JP2014/062155
§ 371 (c)(1),
(2) Date: Oct. 30, 2015

(87) PCT Pub. No.: WO2014/181770
PCT Pub. Date: Nov. 13, 2014

(65) Prior Publication Data
US 2016/0079538 A1    Mar. 17, 2016

(30) Foreign Application Priority Data

May 8, 2013    (JP) ................. 2013-098523

(51) Int. Cl.
*H01L 51/00* (2006.01)
*H01L 51/56* (2006.01)

(52) U.S. Cl.
CPC .......... *H01L 51/0014* (2013.01); *H01L 51/56* (2013.01); *H01L 51/0072* (2013.01); *H01L 51/0081* (2013.01); *H01L 51/0085* (2013.01)

(58) Field of Classification Search
None
See application file for complete search history.

(56) References Cited

U.S. PATENT DOCUMENTS

| 6,154,288 A * | 11/2000 | Watanabe | ............ H04N 1/4074 358/1.9 |
| 2005/0185249 A1* | 8/2005 | Uchiyama | .......... G02B 13/0095 359/291 |
| 2016/0087211 A1* | 3/2016 | Morikawa | ............... H01L 51/56 438/7 |

FOREIGN PATENT DOCUMENTS

| JP | 2793373 B2 | 9/1992 |
| JP | 2008135306 A | 6/2008 |

(Continued)

OTHER PUBLICATIONS

International Search Report dated Aug. 12, 2014 for Application No. PCT/JP2014/062155 and English translation.

(Continued)

*Primary Examiner* — Fernando L Toledo
*Assistant Examiner* — Valerie N Newton
(74) *Attorney, Agent, or Firm* — Lucas & Mercanti, LLP

(57) ABSTRACT

The problem addressed by the present invention is to enable the providing of a method for producing an organic electroluminescent element having a light-emitting pattern having superior gradation characteristics. The method for producing an organic electroluminescent element having a light-emitting pattern formed by means of light irradiation of an organic electroluminescent element provided with one or more organic functional layers between at least a pair of electrodes is characterized in that an image to pattern comprises a highlight section, a shadow section, and a linear section prepared ahead of time, the amount of light irradiation is altered on the basis of a tone reproduction curve having a soft gradation section that is at the highlight section (Continued)

and shadow section and that has a lower gradient inclination than that of the linear section, and thus a light-emitting pattern is formed having a gradient resulting from a light emission brightness corresponding to the amount of light irradiation.

5 Claims, 2 Drawing Sheets

(56) References Cited

FOREIGN PATENT DOCUMENTS

| | | |
|---|---|---|
| JP | 2009535779 A | 10/2009 |
| JP | 2012028335 A | 2/2012 |
| JP | 2012134069 A | 7/2012 |

OTHER PUBLICATIONS

International Preliminary Report on Patentability; International application No. PCT/JP2014/062155; International filing date: May 2, 2014; Priority date: May 8, 2013; Applicant: Konica Minolta, Inc.; total of 4 pages.
English translation of IPRP; total of 3 pages.

* cited by examiner

METHOD FOR PRODUCING ORGANIC ELECTROLUMINESCENT ELEMENT HAVING LIGHT-EMITTING PATTERN

CROSS REFERENCE TO RELATED APPLICATION

This Application is a 371 of PCT/JP2014/062155 filed on May 2, 2014, which, in turn, claimed the priority of Japanese Patent Application No. JP2013-098523 filed on May 8, 2013, both applications are incorporated herein by reference.

TECHNICAL FIELD

The present invention relates to a production method of an organic electroluminescent element provided with a light-emitting pattern having superior tone characteristic.

BACKGROUND

At the present time, an organic electroluminescent element is attracting attention as a thin light-emitting material.

An organic light-emitting element makes use of electroluminescence (EL) of an organic material (hereafter, it is also called as "an organic EL element"). It is a fully solid element which is capable of emitting light with a low voltage such as about several V to several ten V. It has many excellent features of high luminance, high light-emission efficiency, thin and small weight. Accordingly, it has been attracted attention in recent years used for: various display backlights; a display board such as signboard and emergency lamp; and a surface light-emitting body for illumination source.

The organic EL element has a structure in which a light-emitting layer containing an organic material is located between a pair of electrodes, and emitted light in the light-emitting layer is extracted to the outside through the electrode. Therefore, at least one of the pair of electrode is composed of a transparent electrode, and the emitted light is taken out from the transparent electrode side. Moreover, the organic EL element can produce high luminance at a low electric power, and it is excellent in the points of visibility, response speed, lifetime and electric power consumption.

To this organic EL element, it is provided a production method of an organic EL element having a light-emitting pattern. In this method, a non-light-emitting portion is formed in an organic functional layer laminated on a glass substrate by irradiating with UV rays to result in deteriorating the irradiated portion (for example, refer to Patent Document 1 and Patent Document 2).

Further, it is possible to form a light-emitting pattern having a light-emitting luminance of multiple tones if an amount of irradiation is changed when a patterning is done by irradiating the organic EL element with UV rays.

However, when a natural image whose light-emitting luminance is continuously changed is subjected to patterning, it often results in producing an image having different gradation properties from the original image. When a natural image having a continuous gradation is patterned, the produced image becomes unnatural, and it has been difficult to obtain a required image.

PRIOR ART DOCUMENTS

Patent Documents

Patent Document 1: Japanese Patent No. 2793373
Patent Document 2: Japanese Patent Application Publication (JP-A) No. 2012-28335

SUMMARY OF THE INVENTION

Problems to be Solved by the Invention

The present invention has been made in view of the above-described problem and situation. An object of the present invention is to provide a production method of an organic electroluminescent element provided with a light-emitting pattern having superior tone characteristic.

Means to Solve the Problems

In order to solve the above-described problems, the present inventors have investigated the reasons of the problems. And it was found out that the tone characteristic of the light-emitting pattern of the organic electroluminescent element having the light-emitting pattern showed a narrow tone reproduction region at a highlight portion and at a shadow portion. This is a reason to produce an unnatural image. The present invention has been achieved by this finding.

That is, the above-described problems according to the present invention can be solved by the following means.

1. A method of producing an organic electroluminescent element having a light-emitting pattern, the organic electroluminescent element comprising one or a plurality of organic functional layers between at least a pair of electrodes,
    the method comprising the step of:
    forming the light-emitting pattern by light irradiation to the organic electroluminescent element with changing an amount of the light irradiation based on a tone reproduction curve made in advance which has a highlight portion, a shadow portion and a straight line portion, and the highlight portion and the shadow portion each having a soft gradation section with a smaller slope than a slope of a gradation of the straight line portion to result in forming the light-emitting pattern having a gradation by a light-emitting luminance corresponding to the amount of light irradiation.

2. The method of producing an organic electroluminescent element having a light-emitting pattern described in the item 1, wherein the slope of the gradation of the straight line portion in the tone reproduction curve is in the range of 0.6 to 2.0.

3. The method of producing an organic electroluminescent element having a light-emitting pattern described in the item 1 or item 2, wherein a ratio of a maximum light-emitting luminance to a minimum light-emitting luminance of the organic electroluminescent element is 10 or more.

4. The method of producing an organic electroluminescent element having a light-emitting pattern described in any one of the items 1 to 3,
    wherein the soft gradation section in the highlight portion of the tone reproduction curve is in the range of at least −0.20 in common logarithm unit of the light-emitting luminance (log(light-emitting luminance)) from a maximum light-emitting luminance of the organic electroluminescent element having a light-emitting pattern; and
    the soft gradation section in the shadow portion is in the range of at least +0.20 in common logarithm unit of the light-emitting luminance (log(light-emitting luminance)) from a minimum light-emitting luminance of the organic electroluminescent element having a light-emitting pattern.

5. The method of producing an organic electroluminescent element having a light-emitting pattern described in any one of the items 1 to 4, wherein the light-emitting pattern formed by light irradiation is a light-emitting pattern formed by irradiation with light including UV rays.

Effects of the Invention

By the above-described embodiments of the present invention, it can provide a production method of an organic electroluminescent element provided with a light-emitting pattern having superior tone characteristic.

A formation mechanism or an action mechanism of the effects of the present invention is supposed as follows.

A light-emitting pattern obtained by irradiating an organic EL element with light such as UV rays is a negative image. When this negative image is simply converted to a positive image, the tone characteristic of the patterned image is largely different from the tone characteristic of the original image, due to the luminance reciprocity law failure at the time of exposure of the organic EL element to light irradiation, and the optical response characteristics of the organic EL element. A contrast of light-emitting properties of an organic EL element is generally low, as a result, there will be often lost information of a highlight portion and a shadow portion in particular, when a tone is tried to reproduce in a limited contrast. Consequently, an unnatural image is produced. By using a production method in which a softer gradation section with a smaller slope is provided in the highlight portion and in the shadow portion than the slope of the gradation of the straight line portion, the gradation of the highlight portion will be hardly lost, and it can obtain an image excellent in tone characteristic.

EMBODIMENTS TO CARRY OUT THE INVENTION

Figure 1:
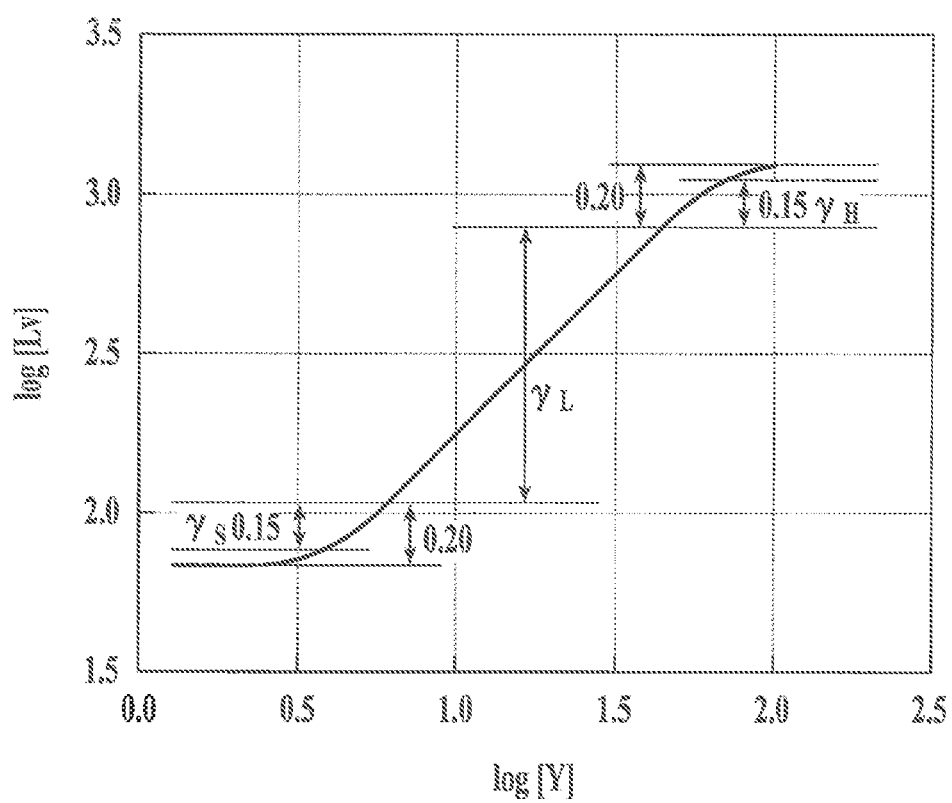
FIG. 1 is an example of a tone reproduction curve having a softer gradation section with a smaller slope in a highlight portion and in a shadow portion than a slope of a gradation of a straight line portion.

A method of producing an organic electroluminescent element having a light-emitting pattern of the present invention is a method of producing an organic electroluminescent element having a light-emitting pattern by light irradiation to the organic electroluminescent element comprising one or a plurality of organic functional layers between at least a pair of electrodes. An image to be patterned is formed as follows. The light-emitting pattern is formed by light irradiation with changing an amount of the light irradiation based on a tone reproduction curve made in advance which has a highlight portion, a shadow portion and a straight line portion, and the highlight portion and the shadow portion each have a soft gradation section having a smaller slope than a slope of a gradation of the straight line portion to result in the light-emitting pattern having a gradation produced by a light-emitting luminance corresponding to the amount of the light irradiation.

An embodiment of the present invention is, from the viewpoint of obtaining an effect of the present invention, preferably a method in which the slope of the gradation of the straight line portion in the tone reproduction curve is in the range of 0.6 to 2.0. Further, it is preferable that a ratio of a maximum light-emitting luminance to a minimum light-emitting luminance of the organic EL element is 10 or more.

Further, in the present invention, the soft gradation section in the highlight portion of the tone reproduction curve is preferably in the range of at least −0.20 in common logarithm unit of the light-emitting luminance (log(light-emitting luminance)) from a maximum light-emitting luminance of the organic electroluminescent element having a light-emitting patter, and the soft gradation section in the shadow portion is preferably in the range of at least +0.20 in common logarithm unit of the light-emitting luminance (log(light-emitting luminance)) from a minimum light-emitting luminance of the organic electroluminescent element having a light-emitting pattern.

Further, it is preferable that the light-emitting pattern formed by light irradiation is a light-emitting pattern formed by irradiation with light including UV rays.

In addition, the light-emitting luminance in the present invention can be measured using an apparatus such as 2D Color Analyzer CA-2000 made by Konica Minolta, Inc. A contrast and a slope of the gradation (it is also called as "γ") can be calculated from the light-emitting luminance with the method described in the present specification.

The present invention and the constitution elements thereof, as well as configurations and embodiments, will be detailed in the following. In the present description, when two figures are used to indicate a range of value before and after "to", these figures are included in the range as a lowest limit value and an upper limit value.

<<Method of Producing an Organic Electroluminescent Element Having a Light-Emitting Pattern>>

A method of producing an organic electroluminescent element having a light-emitting pattern of the present invention is a method in which a light-emitting pattern is formed by light irradiation to the organic electroluminescent element comprising one or a plurality of organic functional layers between at least a pair of electrodes.

A light-emitting pattern is formed by changing an amount of the light irradiation based on a tone reproduction curve containing a shadow portion and a straight line portion, and the highlight portion and the shadow portion each have a soft gradation section having a smaller slope than a slope of a gradation of the straight line portion to result in the light-emitting pattern having a gradation produced by a light-emitting luminance corresponding to the amount of the light irradiation.

Here, "a pattern" indicates a design (a pattern or a design of drawing), a character, or an image. "A pattering" means to give a display function of these patterns.

"A light-emitting pattern" is a production source, which is formed (or given) to the organic electroluminescent element beforehand, having a function of producing a predetermined design (a pattern or a design of drawing), a character, or an image when the organic electroluminescent element emits light in order to make emit light by changing the light-emitting intensity (luminance) depending on the location in the light-emitting surface based on the predetermined design (a pattern or a design of drawing), a character, or an image.

The present invention is appropriately applied not only to a natural image such as a scenic image or a person image, but also to a pattern image having a halftone.

<<Light-emitting Pattern>>

Formation of a light-emitting pattern is done by light irradiation. When an image having a halftone is simply exposed imagewise to an organic EL element by light irradiation to obtain a light-emitting pattern, a so-called negative image (an image having inverted light and dark) is produced in which an amount of light-emission of the organic EL element is decreased at the irradiated position. In order to convert a negative image to a positive image, simple use of an inversed signal value of light and dark in an image will not produce a required image.

Further, when an image taken by a digital camera is patterned by irradiating an organic EL element with UV rays, due to the luminance reciprocity law failure at the time of exposure of the organic EL element to light irradiation, the optical response characteristics of the organic EL element, light-dark properties of color space where the image is recorded, and the above-described production of a negative image, the tone characteristic of the patterned image is largely different from the tone characteristic of the original image when this negative image is simply converted to a positive image. In addition, a contrast of light-emitting properties of an organic EL element is generally low, as a result, there will be often lost information of a highlight portion and a shadow portion in particular, when a tone is tried to reproduce in a limited contrast. Consequently, it was supposed that an unnatural image was produced.

The highlight portion and the shadow portion of the image were focused to investigate. It was found that an image having a natural gradation can be obtained by forming a light-emitting pattern having a gradation of a light-emitting luminance corresponding to the amount of the light irradiation with changing an amount of the light irradiation based on a tone reproduction curve made in advance which has a highlight portion and a shadow portion each having a soft gradation section having a smaller slope than a slope of a gradation of the straight line portion.

(Tone Reproduction Curve Containing a Soft Gradation Section in a Highlight Portion and a Shadow Portion Having a Smaller Slope than a Slope of a Gradation of the Straight Line Portion)

Based on a signal value of a taken image, for example, 8 bits image signals of RGB, sRGB (standard RGB), conversion is carried out to reproduce a color image having a tone of a certain luminance on a sRGB monitor, and it can be observed.

Here, a signal value of an image indicates a RGB value in a color space where an image is recorded with a digital camera or a scanner. It can be cited a RGB value in a color space (for example, sRGB or Adobe RGB).

In the present invention, a tone reproduction curve shows a relation between a brightness of a signal value to be patterned and a brightness of light-emission after the signal is patterned. The unit of brightness is preferably represented by luminance. Specifically, a curve showing a relationship between a common logarithm (log(Y)) of a tristimulus value Y, which is derived from a signal value of an image in a color space, and a common logarithm (log(Luminance), or it is named as log(Lv)) of a light-emitting luminance of a patterned electroluminescent element can be used as a tone reproduction curve. In the present invention, this tone reproduction curve is composed of a highlight portion, a shadow portion and a straight line portion which are made in advance. The highlight portion and the shadow portion each have a soft gradation section having a smaller slope than a slope of a gradation of the straight line portion. An amount of the light irradiation is changed based on this tone reproduction curve to result in forming the light-emitting pattern having a gradation by a light-emitting luminance corresponding to the amount of the light irradiation.

A tristimulus value Y designates Y in tristimulus values defined in CIE 1931 Colorimetric system. In the present invention, a common logarithm of this tristimulus value Y is treated as brightness information of each signal value which constitutes a pattern. By considering the relationship of a logarithm of light-emitting luminance from the organic EL element having a light-emitting pattern, an amount of the light irradiation is changed based on the tone reproduction curve made in advance so as to control the light-emitting luminance corresponding to the amount of the light irradiation. Thus, it can obtain an image having a superior tone characteristic.

In a tone reproduction curve, when luminance information obtained from signal values constituting an original image and luminance information obtained after patterning from the same signal values produce a straight line having a slope of 45 degree, the original image and its patterned image will be observed in the same way because the contrast information is reproduced. However, a ratio (contrast) of a maximum light-emitting luminance to a minimum light-emitting luminance of an organic EL element is smaller than that of an original image. Further, the latitude to an amount of the light irradiation at the time of patterning is small. From these reasons, it cannot be obtained an image having a superior tone characteristic. In the present invention, an image having a superior tone characteristic can be obtained by patterning based on a tone reproduction curve made in advance having a softer gradation section with a smaller slope in a highlight portion and in a shadow portion than a slope of a gradation of a straight line portion.

Next, it will be described the detail of a tone reproduction curve made in advance having a softer gradation section with a smaller slope in a highlight portion and in a shadow portion than a slope of a gradation of a straight line portion by referring to a drawing.

FIG. 1 is an example of a tone reproduction curve of the present invention which is made in advance and has a softer gradation section with a smaller slope in a highlight portion and in a shadow portion than a slope of a gradation of a straight line portion. The horizontal axis is a common logarithm (log(Y)) of a tristimulus value Y derived from a signal value of an image in a color space, and the vertical axis is a common logarithm (log(Lv)) of a light-emitting luminance of an organic EL element having a light-emitting pattern. It is not necessarily required that the light-emitting luminance of the vertical axis has an absolute value near to the luminance of the original image. The tone reproduction curve may be shifted in a parallel direction with respect to a vertical axis. In this case, although the brightness is different, the tone characteristic is observed in the similar way.

A tone reproduction curve according to the present invention is composed of a highlight portion, a shadow portion, and a straight line portion, and it has a softer gradation section with a smaller slope in the highlight portion and in the shadow portion than a slope of a gradation of the straight line portion.

It is preferable that the softer gradation section in the highlight portion is in the range of at least −0.20 in common logarithm unit of the light-emitting luminance (log(light-emitting luminance)) from a maximum light-emitting luminance of the organic electroluminescent element having a light-emitting pattern. Further, it is preferable that the soft gradation section in the shadow portion is in the range of at least +0.20 in common logarithm unit of the light-emitting luminance (log(light-emitting luminance)) from a minimum light-emitting luminance of the organic electroluminescent element having a light-emitting pattern.

In the present invention, it is preferable that a shadow portion of a tone reproduction curve has a slope of gradation $\gamma_S$ in the range of 80% or less with respect to a slope of gradation $\gamma_L$ (a slope of gradation in the straight line portion), $\gamma_S$ being a value between a common logarithm+0.05 and a common logarithm+0.20 from a minimum light-emitting luminance of an organic EL element having a light-emitting pattern, and $\gamma_L$ being a value between a common logarithm unit−0.20 from a maximum light-emitting luminance and a common logarithm unit+0.20 from a minimum light-emitting luminance. It is more preferable that $\gamma_S$ is in the range of 30 to 70% of $\gamma_L$.

In the present invention, it is preferable that a highlight portion of a tone reproduction curve has a slope of gradation in the range of 80% or less with respect to a slope of gradation $\gamma_L$ (a slope of gradation in the straight line portion), $\gamma_H$ being a value between a common logarithm unit−0.05 and a common logarithm unit−0.20 from a maximum light-emitting luminance of an organic EL element having a light-emitting pattern, and $\gamma_L$ being a value between a common logarithm unit−0.20 from a maximum light-emitting luminance and a common logarithm unit+0.20 from a minimum light-emitting luminance. It is more preferable that $\gamma_H$ is in the range of 30 to 70% of $\gamma_L$.

In the present invention, a straight line portion in a tone reproduction curve is a region between a common logarithm unit−0.20 from a maximum light-emitting luminance and a common logarithm unit+0.20 from a minimum light-emitting luminance It is preferable that the slope of the gradation of the straight line portion $\gamma_L$ is in the range of 0.6 to 2.0. More preferably, it is in the range of 0.8 to 1.50.

It is preferable that the tone reproduction curve is a straight line in this region. "A straight line" means that the variation of the slope of the gradation in this region is within ±50% with respect to an arithmetic average. Specifically, a slope of gradation is measured at every 0.1 logarithm unit within this region in the horizontal axis, and when all of the measured values are within the range of ±50% with respect to an arithmetic average, it is called that a straight line. More preferably, it is within ±30%.

A slope of a gradation means a value of $\Delta \log(Lv)/\Delta \log(Y)$ in a tone reproduction curve. A slope of a gradation in a straight line portion means a value of $\Delta \log(Lv)/\Delta \log(Y)$ in the above-described region in the tone reproduction curve. Here, Lv is a light-emitting luminance of an organic EL element having a light-emitting pattern.

In order to make use of light-emitting properties of an organic EL element having a light-emitting pattern, it is preferable that a common logarithm value of a maximum light-emitting luminance and a common logarithm value of a minimum light-emitting luminance in this tone reproduction curve each respectively correspond to a common logarithm value of a maximum light-emitting luminance and a common logarithm value of a minimum light-emitting luminance obtained when an appropriate electric power is applied to the organic EL element. A preferable range of a maximum light-emitting luminance is 150 to 5,000 cd/m². When the contrast of the organic EL element is low and the reproduced range is small, a highlight portion may be preferentially reproduced. Signal values in a specific range may be converted in such a manner that the tone reproduction curve of the present invention is formed. When the reproduced tone reproduction curve has a softer gradation section with a smaller slope in the highlight portion and in the shadow portion than a slope of a gradation of the straight line portion, it can obtain an organic EL element having a light-emitting pattern containing an image having a superior ton characteristic.

The improved effect of this tone characteristic is remarkable when it is used an organic EL element having a narrow reproducing region and a low contrast. In this case, the reproducing properties of a highlight portion and a shadow portion are excellent.

It is preferable that an organic EL element having a light-emitting pattern of the present invention has a ratio of a maximum light-emitting luminance to a minimum light-emitting luminance (a contrast) is 10 or more. More preferably, it is in the range of 30 to 1,000.

(Conversion of Image Signal Value)

Since an irradiated image becomes a negative image, an amount of the light irradiation is changed with tone conversion which enables to achieve a tone reproduction curve having a softer gradation section with a smaller slope in the highlight portion and in the shadow portion than a slope of a gradation of the straight line portion. In this process, it is also done correction of a non-linear property of an organic EL element with respect to an exposure amount as well as the luminance reciprocity law failure property with respect the exposure.

The tone conversion of image may be directly done by converting a signal value using a LUT (look-up table). The tone may be converted by adjusting an amount of transmitted light with a mask (negative image) of an image prepared separately to achieve a tone reproduction curve having a softer gradation section with a smaller slope in the highlight portion and in the shadow portion than a slope of a gradation of the straight line portion. In this case, patterning can be done with one-shot exposure by contacting the organic EL element with the mask. Among these, preferable is a method in which the image signal value is tone-converted at first, then, producing an organic EL element having a light-emitting pattern with light irradiation. This method is preferable since it can reduce the production time of the pattern.

In the following, it will be described a method of changing an amount of the light irradiation by tone converting the image signal value based on a tone reproduction curve made in advance and having a softer gradation section with a smaller slope in the highlight portion and in the shadow portion than a slope of a gradation of the straight line portion.

The relation between the original image signal value and the brightness can be represented by the relation between the signal value of the color space where the image is recorded and a common logarithm of a tristimulus value Y. In the tone reproduction curve, this tristimulus value Y is treated as a luminance, it is used as a horizontal axis.

When an image is taken as an original image, it can obtain a signal value in a color space expected for reproduction by converting to a tristimulus value Y. A common camera for amateur use is often designed based on the assumption of a sRGB color space. In this case, the image signal value is converted to a tristimulus value Y according to the standard defined in IEC 61966-2-1, and a common logarithm of Y is used. In the same manner, the image signal value in other color space can be converted to a tristimulus value Y. By using a common logarithm of Y, the brightness of the image can be treated as luminance.

For example, the conversion process of the image signal value in sRGB color space using a LUT is as follows.

(1) To Determine a Relation between a Relative Amount of the Light Irradiation to an Organic EL Element and a Light-emitting Luminance.

First, it is obtained a relation between a relative amount of the light irradiation to an organic EL element under a predetermined condition and a light-emitting property of an organic EL element whose light-emission is hindered by light irradiation. Here, a relative amount of the light irradiation can be represented by a product (in joules) of an amount of the light irradiation (W/cm²) and an irradiation time (second). That is, it is obtained a relation between a relative amount of the light irradiation as a property of an organic EL element and an amount of light-emitting (light-emitting luminance) of an organic EL element whose light-emission is hindered by light irradiation. Specifically, UV rays are irradiated to an organic EL element with changing an amount of transmitted light a through an optical wedge (hereafter, it is also called as a wedge). The relation can be obtained by making correspondence of an amount of light-emitting to each amount of transmitted light.

(2) To Determine a Relation between an Image Signal Value and a Relative Amount of the Light Irradiation Next, the image signal value is converted to a tristimulus value Y. It is obtained a relative amount of the light irradiation corresponding to a light-emitting luminance of a tone reproduction curve having a softer gradation section with a smaller slope in the highlight portion and in the shadow portion than a slope of a gradation of the straight line portion. Specifically, $\log(Y_A)$ is obtained from a signal value A in a color space. Subsequently, based on the tone reproduction curve having a softer gradation section with a smaller slope in the highlight portion and in the shadow portion than a slope of a gradation of the straight line portion, it is obtained a luminance value $L_{VA}$ which is expected to emit light by the signal value when pattering is made.

(3) To Determine a Conversion Table (LUT) from the Relation between the Image Signal Value and the Light-emitting Luminance Subsequently, as determined in (1), a relative amount of the light irradiation and a light-emitting luminance make one-to-one correspondence. Therefore, the relation between a relative amount of the light irradiation to an organic EL element and a light-emitting luminance determined in (1) is used as a calibration curve. Then, a tristimulus Y' which gives $L_{VA}$ determined in (2) is obtained. Further, the signal value that produces this Y' value is determined from the relation between the signal value in the color space and log(Y). Thus, a conversion table (LUT) can be obtained by determining the corresponding relation between the original image signals and the output image signal values based on the tone reproduction curve with respect to all of the data.

In the present invention, a LUT is determined based on the fact that a relative amount of the light irradiation and a light-emitting luminance make one-to-one correspondence. In this case, it is preferable to set up that an amount of light-emission of an organic EL element is maximum when a tristimulus value Y is 100 (log Y=2).

Subsequently, the original image is converted using the obtained LUT, and it can obtain the converted image data X', Y' and Z'. The signal values X', Y' and Z' are reversely converted to R', G', and B' based on the standard defined in IEC 61966-2-1. Thus, the tone converted output image data can be obtained.

<Constitution of Organic Electroluminescent Element>

An organic EL element according to the present invention is provided with one or plural organic functional layers between at least a pair of electrodes. An organic functional layer of the present invention indicates a layer containing an organic compound. For example, it can cite: a hole injection layer, a hole transport layer, a light emitting layer (including a blue emitting layer, a green emitting layer, and a red emitting layer), an electron transport layer, and an electron injection layer. Preferably, an organic functional layer includes a light emitting layer.

An organic EL element according to the present invention may have a various constitutions. An example of the constitutions is shown in FIG. 2.

Figure 2:
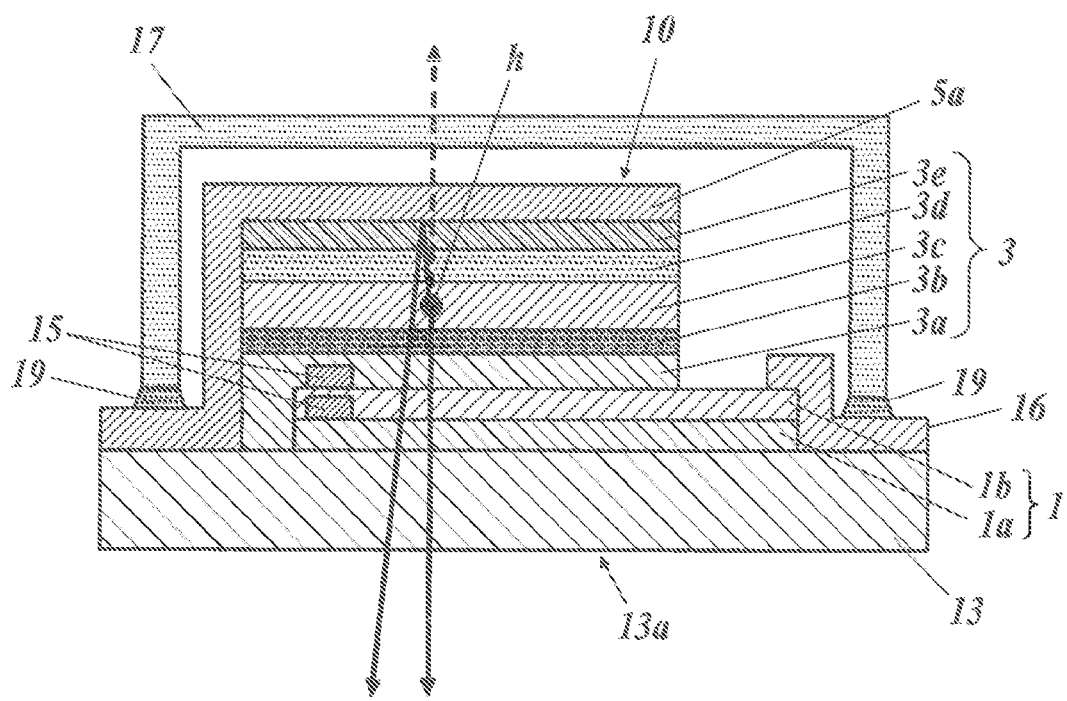
FIG. 2 is an example of a cross-sectional view showing a schematic constitution of an organic EL element.

As shown in FIG. 2, an organic EL element 10 according to the present invention is placed on a substrate 13. From the side of the substrate 13, it is constituted by sequentially laminating: a first electrode 1 (transparent electrode), organic functional layers 3 composed of an organic material, and a second electrode 5a (opposite electrode) in this order. At an edge portion of the first electrode 1 (electrode layer 1b), a taking-out electrode 16 is provided. The first electrode 1 is electrically connected to an outer electric source (not shown in the figure) through the taking-out electrode 16. The organic EL element 10 is constituted in such a manner that the generated light (emitted light h) is taken out at least from the side of the substrate 13.

The layer constitution of the organic EL element 10 is not limited, and it may be a generally known layer constitution. Here, it is decided that the first electrode 1 will function as an anode (positive pole), and the second electrode 5a will function as a cathode (negative pole). In this case, it is shown an example of a constitution in which the organic functional layers 3 are formed by sequentially laminating from the side of the first electrode 1 (anode): a hole injection layer 3a/a hole transport layer 3b/a light-emitting layer 3c/an electron transport layer 3d/an electron injection layer 3e. Among these, it is indispensable to contain a light-emitting layer 3c composed of at least an organic material. The hole injection layer 3a and the hole transport layer 3b may be placed as a hole transport-injection layer. The electron transport layer 3d and the electron injection layer 3e may be placed as an electron transport-injection layer. Among the organic functional layers 3, for example, there is a case where the electron injection layer 3e is composed of an inorganic material.

Further, in addition to these layers, the organic functional layers 3 may be formed by laminating a hole blocking layer or an electron blocking layer at a required palace when needed. Moreover, the light-emitting layer 3c may contain color emitting layers each generating emitting light having each wave length region. The light-emitting layer 3c may be laminated with these color emitting layers through a non-light-emitting intermediated layer. The intermediated layer may have a function of a hole blocking layer or an electron blocking layer. In this constitution, only the portion of the organic functional layers 3 interposed between the first electrode 1 and the second electrode 5a becomes a light-emitting region in the organic EL element 10.

In the layer constitution as described above, a supplemental electrode may be placed in contact with the electrode layer 1b of the first electrode 1 in order to achieve a lower resistivity of the first electrode 1.

The organic EL element 10 having a constitution as described above is sealed with a sealing material 17 (will be described later) on the substrate 13 for the purpose of inhibiting degradation of the organic functional layers 3 composed of organic materials. This sealing material 17 is bonded to the side of the substrate 13 through an adhesive 19. Provided that edge portions of the first electrode 1 (taking-out electrode 16) and the second electrode 5a are placed in the exposed condition from the sealing material 17 while keeping a mutually insulating property by the organic functional layers 3 on the substrate 13.

<<Production Method of Organic EL Element>>

Here, a production method of an organic EL element shown in FIG. 1 is described as an example.

(1) Laminating Step

In the production method of organic EL element according to the present invention, it is carried out a step (laminating step) of laminating a first electrode 1, organic functional layers 3, and a second electrode 5a on a substrate 13.

First, a substrate 13 is prepared. On the substrate 13, it is formed an underlayer 1a composed of a nitrogen containing compound with a thickness in the range of 1 μm or less, preferably, in the range of 10 to 100 nm by a suitable method such as a vapor deposition method.

Subsequently, it is formed an electrode layer 1b composed of silver (or an alloy mainly made of silver) with a thickness in the range of 12 nm or less, preferably, in the range of 4 to 9 nm on the underlayer 1a by a suitable method such as a vapor deposition method. Thus, a first electrode 1 to become an anode is produced. At the same time, a taking-out electrode 16 which is connected to an outer electric source is formed at an edge of the first electrode 1 by a suitable method such as a vapor deposition method.

Subsequently, on this, organic functional layers 3 are formed by laminating: a hole injection layer 3a, a hole transport layer 3b, a light-emitting layer 3c, an electron transport layer 3d, and an electron injection layer 3e in that order.

These layers each may be formed with a spin coating method, a casting method, an inkjet method, a vapor deposition method, and a printing method. From the viewpoint of obtaining a homogeneous layer and hardly producing pinholes, a vacuum vapor deposition method, or a spin coating method is particularly preferred. It may be applied a different formation method for each layer. When a vapor deposition method is employed for forming each of these layers, the deposition conditions may vary depending on the type of compound used. Usually, it is preferable to suitably select the conditions of: a boat heating temperature of 50 to 450° C., a vacuum level of $1\times10^{-6}$ to $1\times10^{-2}$ Pa, a deposition rate of 0.01 to 50 nm/sec, a substrate temperature of −50 to 300° C. and a thickness of 0.1 to 5 μm.

After forming the organic functional layers 3 as described above, the second electrode 5a to become a cathode is formed on the upper portion by a suitable forming method such as a vapor deposition method or a sputtering method. Here, the second electrode 5a is formed in a pattern having a form of pulling out an edge portion from the upper portion of the organic functional layers 3 to a periphery of the resin substrate 13, while maintaining the insulated state with respect to the first electrode 1 by the organic functional layers 3.

(2) Sealing Step

After the laminating step, a step of sealing the organic functional layers 3 (sealing step) is carried out.

That is, the sealing material 17 is placed on the substrate 13 to cover at least the organic functional layers 3, while keeping the edge portions of the first electrode 1 (taking-out electrode 16) and the second electrode 5a in the exposed condition.

(3) Light Irradiation Step

An organic electroluminescent element is irradiated by changing an amount of the light irradiation based on a tone reproduction curve made in advance having a softer gradation section with a smaller slope in a highlight portion and in a shadow portion than a slope of a gradation of a straight line portion (light irradiation step). The light-emitting function of the organic functional layers 3 is changed by light irradiation and it can produce an organic EL element having a light-emitting pattern. In the light irradiation step, the method of the light irradiation may be any method and it is not specifically limited as long as it can make a light-emitting portion which is changed the luminance at a predetermined pattern region of the organic functional layers 3 by a predetermined light irradiation.

Light irradiated in the light irradiation step may contain UV rays, visible rays or infrared rays. Preferably, it contains UV rays.

In the present invention, a UV ray is an electromagnetic wave having a longer wavelength than an X ray and a shorter wavelength than a shortest wavelength of a visible light. Specifically, it is a wave having a wavelength of 1 to 400 nm.

A generating means and irradiation means of UV rays is not specifically limited as long as they generate UV rays and irradiate with conventionally known apparatus. Examples of a specific light source are: a high pressure mercury lamp, a low pressure mercury lamp, a hydrogen (deuterium) lamp, a rare gas (e.g., xenon, argon, helium, neon) discharge lamp, a nitrogen laser, an excimer laser (e.g., XeCl, XeF, KrF, KrCl), a hydrogen laser, a halogen laser, a harmonic wave light of various visible (LD) to infrared laser (e.g., THG (Third Harmonic Generation) of YAG laser), and a light-emitting diodes (LED).

This light irradiation step is preferably done after the sealing step.

Here, when the second electrode 5a does not have translucency, the light irradiation is done from the side of the light taking-out surface 13a of the substrate 13. In this case, the light irradiation is done to the organic functional layers 3 through the substrate 13. By considering the fact that the substrate 13 absorbs a certain amount of the irradiation light, it is required to secure a sufficient irradiation time. Since the light irradiation step is done after the sealing step, it is possible to expose the sealed element to the atmosphere (open system). It is not required to carry out the irradiation step in a closed system such as a chamber. Consequently, an organic EL element having a light-emitting pattern can be produced in a simple and low cost production process.

The irradiation step may be done before the sealing step. It may be done after forming the organic functional layers 3 and before forming the second electrode 5a in the laminating step. In this case, the light irradiation may be done from the side of the substrate 13, or from the side of the organic functional layers 3.

In the irradiation step, it is possible to change the light-emitting luminance of the irradiated portion in proportion to the amount of the irradiation by changing the amount of the irradiation with adjusting the irradiation intensity an time. The larger the amount of the irradiation, the more decreased the light-emitting luminance. The smaller the amount of the irradiation, the less the decreased rate of the light-emitting luminance. Therefore, when the amount of the irradiation is 0, namely when the light irradiation is not done, the light-emitting luminance is maximum.

By this, it is possible to change the strength of the light-emitting luminance in the produced organic EL element. It is also possible to change the strength by increase or decrease of the driving electric current. Although the driving voltage becomes higher with the decrease of the luminance, the luminance to voltage property is stable with the passage of time. As a result, it can produce an organic EL element which produces a gradation of strength of the light-emitting luminance in the light-emitting area at the time of light emission.

By the steps described above, an organic EL element having a required light-emitting pattern can be produced. In the production of the organic EL element 10, it is preferable that the production from the organic functional layers 3 to the second electrode 5a is done with one time vacuuming operation. However, it may employ a different production method by taking out the substrate 13 from the vacuum atmosphere on the way. In that case, it is required to conduct the operations under a dry inert gas atmosphere.

When a direct-current voltage is applied to the produced organic EL element 10, the first electrode 1 as an anode is made to have a plus (+) polarity, and the second electrode 5a as a cathode is made to have a minus (−) polarity. By applying voltage of 2 o 40 v, light emission can be observed. Further, an alternating-current voltage may be applied. In addition, an arbitrary wave shape may be used for the applying alternating-current.

In the following, it will be described the detail of the principal layers for constituting the above-described organic EL element 10, and their production methods.

<Substrate>

It is preferable that the substrate 13 is basically composed of a substrate as a support and one or more barrier layers having a refractive index of 1.4 to 1.7.

(1) Base Material

As a base material according to the present invention, any conventionally known base materials may be used without any limitation. A preferable base material used for the present invention is a material having a gas barrier property of moisture resistance and gas permeation resistance required for an organic EL element.

In the present invention, when the side of the substrate 13 of the organic EL element 10 is a light-emitting surface, a visible light transmitting material is used for the base material. In this case, it is preferable that a light transmittance at a wavelength of 550 nm is 70% or more, more preferably, 75% or more, and still more preferably, 80% or more.

Further, the base material preferably has flexibility. Here, "flexibility" is a property of the base material which will not produce cracks during the process of winding the substrate around a roll of 50 mm diameter (Φ) and rewinding with a predetermined tension. A base material which can be wound around a roll of 30 mm diameter (Φ) is more preferable.

In the present invention, the substrate is a conventionally known substrate such as alkali-free glass, soda glass, and a resin substrate. Examples of a resin substrate are: acrylic resins such as an acrylic acid ester, a methacrylic acid ester, and PMMA; and various resin films such as polyethylene terephthalate (PET), polybutylene terephthalate, polyethylene naphthalate (PEN), polycarbonate (PC), polyallylate, polyvinyl chloride (PVC), polyethylene (PE), polypropylene (PP), polystyrene (PS), Nylon (Ny), aromatic polyamide, polyether ether ketone, polysulfone, polyether sulfonate, polyimide, polyether imide, polyolefin. Further, it may also be used films of cycloolefin or cellulose ester. It may be cited a heat-resistant transparent film having an organic-inorganic hybrid structure containing a silsesquioxane basic skeleton (product name Sila-DEC, made by Chisso Corporation). Further, a resin film formed by laminating two or more layers of the above-described resin materials can be cited.

From the viewpoint of cost and availability, alkali-free glass, soda glass, PET, PEN, PC, and acrylic resin are preferably used.

In the case of the resin substrate, from the viewpoint of transparency, heating resistance, easiness of handling, strength and cost, biaxially stretched polyethylene terephthalate and biaxially stretched polyethylene naphthalate are preferable.

Further, in order to restrain the contraction to a maximum degree during thermal expansion, it is preferable to use a thermal treated substrate which is subjected a thermal annealing treatment.

A thickness of the substrate is preferably 10 to 500 μm, more preferably, it is 20 to 250 μm, and still more preferably, it is 30 to 150 μm. By using the substrate having a thickness in the range of 10 to 500 μm, a stable gas barrier property can be obtained, and it becomes suitable for transportation in a roll-to-roll production method.

(2) Barrier Layer (2.1) Properties and Forming Method

In the present invention, a substrate 13 may be provided with a barrier layer (low refractive index layer) having a refractive index of 1.4 to 1.7. As such a barrier layer, known materials can be used without specific limitation. It may be a coating membrane made of an inorganic compound or an organic compound, or a hybrid membrane made of the combination of these coating membranes.

A barrier layer is preferably a barrier film (it is also called as a barrier membrane) having a water vapor permeability of 0.01 g/(m$^2 \cdot$24 h) or less (at 25±0.5° C., relative humidity: 90±2% RH) determined by the method based on JIS K 7129-1992. More preferably, a barrier layer is a high barrier film having an oxygen permeability of $1 \times 10^{-3}$ ml/(m$^2 \cdot$24 h·atm) or less determined by the method based on JIS K 7126-1987, and a water vapor permeability of $1 \times 10^{-5}$ g/(m$^2 \cdot$24 h) or less.

As materials which form a barrier film, the employed materials may be those which retard penetration of moisture and oxygen, which deteriorate the element. For example, it is possible to employ silicon oxide, silicon dioxide, and silicon nitride. Further, in order to improve the brittleness of the aforesaid film, it is more preferable to achieve a laminated layer structure with a layer (organic layer) made of an organic material on the inorganic layer. The laminating order of the inorganic layer and the organic layer is not particularly limited, but it is preferable that both are alternatively laminated a plurality of times.

Barrier film forming methods are not particularly limited, and examples of employable methods include a vacuum deposition method, a sputtering method, a reactive sputtering method, a molecular beam epitaxy method, a cluster ion beam method, an ion plating method, a plasma polymerization method, a plasma CVD method, a laser CVD method, a thermal CVD method, and a coating method. Of these, specifically preferred is a method employing an atmospheric pressure plasma polymerization method, described in JP-A No. 2004-68143.

(2.2) Inorganic Precursor Compound

Further, a barrier layer may be formed by applying a coating liquid containing at least one inorganic precursor compound.

Any suitable methods may be used for a coating method.

Specific examples of a coating method include: a roller coat method, a flow coat method, an inkjet method, a spray coat method, a printing method, a dip coat method, a casting film forming method, a bar coat method and a gravure printing method.

A coating thickness may be appropriately set up according to the purpose. For example, a coating thickness may be set up so that the thickness after being dried is preferably about 0.001 to 10 μm, more preferably, it is in the range of 0.01 to 10 μm, still more preferably, it is in the range of 0.03 to 1 μm.

An inorganic precursor compound used for the present invention is not specifically limited as long as it is a compound which forms a metal oxide, a metal nitride or a metal oxinitride by irradiation with vacuum ultraviolet rays under a specific condition. However, as a compound suitable for the production method of the present invention, preferable is a compound which can be reformed at a relatively low temperature as described in JP-A No. 8-112879.

Specifically, it can cite: polysiloxane having a Si—O—Si bond (including polysilsesquioxane), polysilazane having a Si—N—Si bond, and polysiloxazane having both a Si—O—Si bond and a Si—N—Si bond. These may be used by mixing two or more. Further, it can be used by sequentially or simultaneously laminating different compounds.

<First Electrode (Transparent Electrode)>

All of the electrode materials which can be used for a usual organic EL element may be used for a first electrode. Specific examples are: aluminum, silver, magnesium, lithium, magnesium/copper mixture, magnesium/silver mixture, magnesium/aluminum mixture, magnesium/indium mixture, indium, lithium/aluminum mixture, rare earth metals, and oxide semiconductors such as ITO, ZnO, $TiO_2$, and $SnO_2$.

In the present invention, the first electrode is preferably a transparent electrode. Further preferably, it is a transparent metal electrode.

For example, as illustrated in FIG. 2, a first electrode 1 has a two layer structure formed by laminating an underlayer 1a on a side of a substrate 13, followed by laminating thereon an electrode layer 1b in this order. Among them, the electrode layer 1b is a layer constituted of silver or an alloy containing silver as a main component. The underlayer 1a is a layer constituted of a compound containing a nitrogen atom, for example.

Transparency of the first electrode indicates the state that a transmittance value of light at a wavelength of 550 nm is 50% or more. The main component in the electrode layer 1b is a material which in contained in the electrode layer 1b in an amount of 98 mass % or more.

(1) Underlayer

The underlayer 1a is a layer located on the electrode layer 1b at the side of the substrate 13. A material constituting the underlayer 1a is not specifically limited.

It may be a material which can prevent aggregation of silver at the time of film formation of the electrode layer 1b made of silver or an alloy containing silver as a main component. For example, it may use a nitrogen containing compound.

A thickness of the underlayer 1a may be set to be 1 μm or less. Preferably, a thickness of layer is in the range of 10 to 100 nm.

Examples of a film forming method of the underlayer 1a are: a wet process such as a coating method, an inkjet method, a coating method, and a dip method; and a dry method such as vapor deposition method (resistance heating method, EB method), a sputtering method, and a CVD method. Among these, a vapor deposition method is preferably employed.

As a compound containing a nitrogen atom which constitutes the underlayer 1a, it is not particularly limited as long as it is a compound containing a nitrogen atom in the molecule. It is preferable that the compound contains a heterocyclic ring having a nitrogen atom as a hetero atom. Examples of a heterocyclic ring containing a nitorgen atom as a hetero atom are: aziridine, azirine, azetidine, azete, azolidine, azoles, aziinane, pyridine, azepane, azepine, imidazole, pyrazole, oxazole, thiazole, imidazoline, pyrazine, morpholine, thiazine, indole, isoindole, benzimidazole, purine, quinoline, isoquinoline, quinoxaline, cinnoline, pteridine, acridine, carbazole, benzo-C-cinnoline, porphyrin, chlorin, and corrin.

(2) Electrode Layer 1b

An electrode layer 1b is a layer composed of silver or an alloy containing silver as a main component. It is a layer formed on the underlayer 1a.

Examples of a film forming method of the electrode layer 1b are: a wet process such as a coating method, an inkjet method, a coating method, and a dip method; and a dry method such as vapor deposition method (resistance heating method, EB method), a sputtering method, and a CVD method. Among these, a vapor deposition method is preferably employed.

By forming the electrode layer 1b on the underlayer 1a, the electrode layer 1b has a feature of having a sufficient conductive property without subjecting to a high temperature annealing after formation of the electrode layer 1b. However, when needed, it may be subjected to a high temperature annealing after film formation.

Examples of an alloy containing silver (Ag) as a main component and constituting the electrode layer 1b are: silver magnesium (AgMg), silver copper (AgCu), silver palladium (AgPd), silver palladium copper (AgPdCu), and silver indium (AgIn).

The above-described electrode layer 1b may have a constitution in which plural layers are laminated, each layer being made of silver or containing silver as a main component.

A thickness of the electrode layer 1b is preferably 12 nm or less. More preferably, it is in the range of 4 to 9 nm. When the thickness is smaller than 9 nm, an absorbing component or a reflection component of the layer becomes small, and transmittance of the first electrode 1 becomes large. When the thickness is larger than 4 nm, conductivity of the layer can be sufficiently secured.

The first electrode 1, which has a laminated structure made of the underlayer 1a formed thereon the electrode layer 1b, may be covered with a protective layer on the upper portion of the electrode layer 1b, or may be laminated with other electrode layer. In this case, it is preferable that the protective layer or the other electrode layer has a light transmitting property in order to avoid deterioration of light transmitting property.

(3) Effect of First Electrode (Transparent Electrode)

The first electrode 1 having a constitution as described above has a constitution in which an electrode layer 1b composed of silver or an alloy containing silver as a main component is provided on an underlayer 1a formed by using a nitrogen containing compound. By this constitution, silver atoms composing the electrode layer 1b will interact with the nitrogen containing compound composing the underlayer 1a. As a result, the silver atom will decrease its diffusion distance on a surface of the underlayer 1a, and aggregation of silver atoms will be prevented.

Here, in the film formation of the electrode layer 1b made of silver as a main component, increase of film formation is done with a nucleus growth type (Volumer-Weber: VM type). The silver grains tend to be isolated, and it is difficult to obtain conductivity when the thickens is small. The sheet resistivity will become high. Therefore, it is necessary to increase the thickness to secure the conductivity. When the thickness is increased, the light transmitting property will be decreased. This is not appropriate for the first electrode.

However, in the first electrode 1, aggregation of silver atoms will be prevented on the underlayer 1a as described above. As a result, increase of film formation is done with a mono-layer growth type (Frank-van der Merve: FM type) in the film formation of the electrode 1b composed of silver or an alloy containing silver as a main component.

Here, "transparency" of the first electrode 1 indicates a property that a light transmittance at a wavelength of 550 nm is 50% or more. The above-described materials used for the underlayer 1a is sufficiently transparent compared with the electrode layer 1b made of silver or an alloy containing silver as a main component, and forms a preferable film. On the other hand, the conductivity of the first electrode 1 is secured mainly by the electrode layer 1b. Consequently, the electrode layer 1b made of silver or an alloy containing silver as a main component secures conductivity with a thinner layer. Thus, it is possible to achieve improvement of both conductivity and light transmittance of the first electrode 1.

<Organic Functional Layer>

(1) Light Emitting Layer

Organic functional layers 3 include at least a light-emitting layer 3c.

A light-emitting layer 3c used in the present invention preferably contains a phosphorescence emitting compound as a light-emitting material. It may contain a fluorescent material as a light-emitting material, or it may contain a combination of a phosphorescence emitting compound and a fluorescent material.

This light-emitting layer 3c is a layer in which electrons injected from the electrode or the electron transport layer 3d and holes injected from the hole transport layer 3b are recombined to emit light. The light-emitting portion may be inside of the light-emitting layer 3c, or may be at an interface between the light-emitting layer 3c and the adjacent layer thereto.

The constitution of the light-emitting layer 3c is not specifically limited as long as the contained light-emitting material satisfies the light-emitting requirement. It may be composed of plural layers having the same light-emitting spectrum or the same maximum wavelength. In this case, it is preferable that a non-light-emitting intermediate layer (not illustrated) is contained between each light-emitting layer 3c.

A total thickness of the light-emitting layer 3c is preferably in the range of 1 to 100 nm, more preferably in the range of 1 to 30 nm in order to achieve a lower driving voltage.

Here, the total thickness of the light-emitting layer 3c indicates a thickness including the intermediate layer when there is a non-light-emitting intermediate layer among the light-emitting layer 3c.

When the constitution of the light-emitting layer 3c is made by laminating plural layers, it is preferable that each light-emitting layer is adjusted to have a thickness in the range of 1 to 50 nm, more preferably, in the range of 1 to 20 nm. When the laminated plural light-emitting layers each correspond to an emitting light of blue, green and red, there is no specific limitation to the relationship of the thickness of each light-emitting layer of blue, green and red.

The above-described light-emitting layer 3c may be formed by using known light-emitting material or host compounds with known thin film forming methods such as: a vapor deposition method, a spin coating method a cast method, an LB method, and an inkjet method.

Further, the light-emitting layer 3c may be formed with a mixture of plural light-emitting materials.

As a constitution of the light-emitting layer 3c, it is preferable that it contains a host compound (it is also called as an emission host) and a light-emitting material (it is also called as an emission dopant), and light emission is done from the light-emitting material.

(2) Injection Layer (Hole Injection Layer and Electron Injection Layer)

An injection layer is a layer which is arranged between an electrode and a light-emitting layer 3c to decrease an operating voltage and to improve an emission luminance, which is detailed in volume 2, chapter 2 (pp. 123-166) of "Organic EL Elements and Industrialization Front thereof (Nov. 30 1998, published by N. T. S Corp.)", and includes a hole injection layer 3a and an electron injection layer 3e.

An injection layer may be provided when needed. A hole injection layer 3a may be provided between an anode and a light-emitting layer 3c, and an electron injection layer 3e may be provided between a cathode and a light-emitting layer 3c or an electron transport layer 3d.

A hole injection layer 3a is also detailed in JP-A Nos. 9-45479, 9-260062 and 8-288069. Specific examples include: a phthalocyanine layer represented by copper phthalocyanine; an oxide layer represented by vanadium oxide; an amorphous carbon layer; and a polymer layer employing conductive polymer such as polyaniline (or called as emeraldine) or polythiophene.

An electron injection layer 3e is also detailed in JP-A Nos. 6-325871, 9-17574, and 10-74586. Specific examples include: a metal layer represented by strontium and aluminum; an alkaline metal layer represented by potassium fluoride; an alkaline earth metal layer represented by magnesium fluoride; and an oxide layer represented by molybdenum oxide. The electron injection layer 3e of the present invention is preferably a very thin layer, and the layer thickness is preferably in the range of 1 nm to 10 μm, although it depends on a raw material.

(3) Hole Transport Layer

A hole transport layer 3b contains a material having a function of transporting a hole, and in a broad meaning, a hole injection layer 3a and an electron blocking layer are also included in a hole transport layer. A hole transport layer 3b may be provided as a single layer of or plural layers.

A hole transport material is a material having any one of properties of injecting or transporting a hole, or a barrier property to an electron, and it may be either an organic substance or an inorganic substance. For example, listed materials are: a triazole derivative, an oxadiazole derivative, an imidazole derivative, a polyarylalkane derivative, a pyrazoline derivative, a pyrazolone derivative, a phenylenediamine derivative, an arylamine derivative, an amino substituted chalcone derivative, an oxazole derivatives, a styrylanthracene derivative, a fluorenone derivative, a hydrazone derivative, a stilbene derivative, a silazane derivative, an aniline type copolymer, or conductive polymer oligomer, and specifically, thiophene oligomer.

As a hole transport material, those described above can be utilized, however, it is preferable to utilized a porphyrin compound, an aromatic tertiary amine compound and a styrylamine compound, and specifically preferably, an aromatic tertiary amine compound.

Representative examples of an aromatic tertiary amine compound and a styrylamine compound include: N,N,N',N'-tetraphenyl-4,4'-diaminophenyl; N,N'-diphenyl-N,N'-bis(3-methylphenyl)-(1,1'-biphenyl)-4,4'-diamine (TPD); 2,2-bis (4-di-p-tolylaminophenyl)propane; 1,1-bis(4-di-p- tolylaminophenyl)cyclohexane; N,N,N',N'-tetra-p-tolyl-4,4'-diaminobiphenyl; 1,1-bis(4-di-p-tolylaminophenyl)-4-phenylcyclohexane; bis(4-dimethylamino-2-methyl)phenylmethane; bis(4-di-p-tolylaminophenyl)phenylmethane; N,N'-diphenyl-N,N'-di(4-methoxyphenyl)-4,4'-diaminobiphenyl; N,N,N',N'-tetraphenyl -4,4'-diaminophenylether; 4,4'-bis(diphenylamino)quadriphenyl; N,N,N-tri(p-tolyl)amine; 4-(di-p-tolylamino)-4'-[4-(di-p-triamino)styryl]stilbene; 4-N,N-diphenylamino-(2-diphenylvinyl)benzene; 3-methoxy-4'-N,N-diphenylaminostilbene; and N-phenylcarbazole. In addition to these, a compound having two condensed aromatic rings in the molecule such as 4,4'-bis[N-(1-naphthyl)-N-phenylamino]biphenyl(NDP) described in U.S. Pat. No. 5,061,569, and a compound in which three triphenyl amine units are bonded in a star burst form such as 4,4',4"-tris[N-(3-methylphenyl)-N-phenylamino]triphenylamine (MDTDATA) described in JP-A No. 4-308688.

Polymer materials, in which these materials are introduced in a polymer chain or in the main chain of polymer, can be also utilized. Further, an inorganic compound such as a p-type Si and a p-type SiC can be utilized as a hole injection material and a hole transport material.

Further, it is possible to employ so-called p type hole transport materials, as described in JP-A No. 11-251067, and J. Huang et al., Applied Physics Letters 80(2002), p. 139. In the present invention, since a highly-efficient light-emitting element can be prepared, it is preferable to employ these materials.

A hole transport layer 3b can be prepared by forming a thin layer made of the above-described hole transport material according to a known method such as a vacuum evaporation method, a spin coating method, a cast method, a printing method including an inkjet method and a LB method. A layer thickness of a hole transport layer 3b is not specifically limited, however, it is generally 5 nm to 5 μm, and preferably it is 5 to 200 nm. This hole transport layer may have a single layer structure composed of one or more types of the above-described materials.

Further, it is possible to employ a hole transport layer 3b of a higher p-property achieved by being doped with impurities. As its example, listed are those described in each of JP-A Nos. 4-297076, 2000-196140, 2001-102175, as well as in J. Appl. Phys., 95, 5773 (2004).

In the present invention, it is preferable to employ a hole transport layer 3b of such a high p property, since it is possible to produce an element of lower electric power consumption.

(4) Electron Transport Layer

An electron transport layer 3d contains a material having a function of transporting an electron, and in a broad meaning, an electron injection layer 3e and a hole blocking layer (not illustrated) are also included in an electron transport layer 3d. An electron transport layer 3d may be provided as a single layer of or a laminated structure made of plural layers.

In an electron transport layer 3d of a single layer, or in an electron transport layer 3d of a plural layer structure, an electron transport material (which acts also as a hole blocking material) used for an electron transport layer is only required to have a function of transporting an electron ejected from the cathode to the light-emitting layer 3c. As materials to form an electron transport layer, any of the conventional compounds may be selected and they can be employed. Examples of them include: a nitro-substituted fluorene derivative, a diphenylquinone derivative, a thiopyradineoxide derivative, carbodiimide, a fluorenylidenemethane derivative, anthraquinonedimethane, an anthrone derivative, and an oxadiazole derivative. In addition, a thiadiazole derivative which has a structure of replacing an oxygen atom in the oxadiazole ring with a sulfur atom, and a quinoxaline derivative which has a quinoxaline ring known as an electron inductive group are also used for a material in an electron transport layer 3d. Polymer materials, in which these materials are introduced in a polymer chain or in the main chain of polymer, can be also utilized.

Further, it can be used the following as a material for an electron transport layer 3d: a metal complex of a 8-quinolinol derivative such as tris(8-quinolinol)aluminum ($Alq_3$), tris(5,7-dichloro-8-quinolinol)aluminum, tris(5,7-dibromo-8-quinolinol)aluminum, tris(2-methyl-8-quinolinol)aluminum, tris(5-methyl-8-quinolinol)aluminum and bis(8-quinolinol)zinc (Znq); and metal complexes in which a central metal of the aforesaid metal complexes is substituted by In, Mg, Cu, Ca, Sn, Ga or Pb.

Further, metal-free or metal phthalocyanine, or a compound whose terminal is substituted by an alkyl group or a sulfonic acid group, can be preferably utilized as a material for an electron transport layer 3d. In addition, a distyryl pyrazine derivative used as a material for a light-emitting layer is also used as a material for an electron transport layer 3d. In the same manner as used for a hole injection layer 3a and a hole transport layer 3b, an inorganic semiconductor such as an n-type Si and an n-type SiC can be also utilized as a material for an electron transport layer 3d.

An electron transport layer 3d is preferably formed in a film with the above-described material by the following known methods, for example: a vacuum deposition method, a spin coating method, a cast method, a printing method including an ink-jet method, and a LB method. The layer thickness of the electron transport layer 3d is not specifically limited, however, it is generally about 5 nm to 5 μm, and preferably it is 5 to 200 nm. The electron transport layer 3d may be a single layer structure containing one or more types of the above-described materials.

Further, it is possible to increase an n-property of an electron transport layer 3d by doping with impurities. As its example, listed are those described in each of JP-A Nos. 4-297076, 10-270172, 2000-196140, 2001-102175, as well as in J. Appl. Phys., 95, 5773 (2004). Further, it is preferable to incorporate potassium or a potassium compound in the electron transport layer 3d. As a potassium compound, it can use potassium fluoride, for example. When the n-property of the electron transport layer 3d is made high, it is possible to produce an element of lower electric power consumption.

As a material for an electron transport layer 3d (an electron transport compound), it may use the same compound which constitutes an underlayer 1a as described above. This is the same for an electron transport layer 3d which serves also as an electron injection layer 3e. It may use the same compound which constitutes an underlayer 1a as described above.

(5) Blocking Layer (Hole Blocking Layer and Electron Blocking Layer)

A blocking layer is appropriately provided as one of organic functional layers 3, in addition to the above-described various functional layers. For example, there is a hole blocking (hole block) layer described in JP-A Nos. 11-204258 and 11-204359 and p. 237 of "Organic EL Elements and Industrialization Front thereof (Nov. 30 (1998), published by N. T. S. Corp.)".

A hole blocking layer, in a broad meaning, is provided with a function of an electron transport layer 3d. A hole blocking layer is composed of a material having a function of transporting an electron but a very small ability of transporting a hole. It can improve the recombination probability of an electron and a hole by blocking a hole while transporting an electron. Further, a constitution of an electron transport layer 3d described later can be appropriately utilized as a hole blocking layer according to the present invention when needed. The hole blocking layer is preferably arranged adjacent to the light-emitting layer 3c.

On the other hand, an electron blocking layer has a function of a hole transport layer 3b. An electron blocking layer is composed of a material having a function of transporting a hole but a very small ability of transporting an electron. It can improve the recombination probability of an electron and a hole by blocking an electron while transporting a hole. Further, a constitution of a hole transport layer 3b described later can be appropriately utilized as an electron blocking layer when needed. The thickness of the hole blocking layer according to the present invention is preferably 3 to 100 nm, and more preferably, it is 5 to 30 nm.

<Second Electrode (Opposite Electrode)>

A second electrode 5a is an electrode film that functions as a cathode to supply electrons to the organic functional layers 3. It is used a metal, an alloy, an organic or an inorganic conductive compound, and a mixture thereof. Specifically, it is cited: aluminum, silver, magnesium, lithium, magnesium/copper mixture, magnesium/silver mixture, magnesium/aluminum mixture, magnesium/indium mixture, indium, lithium/aluminum mixture, rare earth metals, and oxide semiconductors such as ITO, ZnO, $TiO_2$, and $SnO_2$.

The second electrode 5a can be produced by forming a thin film by using these conductive materials with a vapor deposition method or a sputtering method. A sheet resistivity of the second electrode 5a is preferably less than several hundred Ω/square, and a layer thickness thereof is usually, in the range of 5 nm to 5 μm, preferably in the range of 5 to 200 nm.

When emitted light h is intended to be taken out also from the side of the second electrode 5a of this organic EL element 10, a good light transparent conductive material is selected among the above-described materials, and the second electrode 5a is suitably constituted.

<Taking-out Electrode>

A taking-out electrode 16 electrically connects a first electrode 1 with an outer electric source. The materials thereof are not specifically limited, and known materials are suitably used. For example, it may use a metal film composed of a three-layered structure of MAM electrode (Mo/Al-Nd alloy/Mo).

<Auxiliary Electrode>

An auxiliary electrode 15 is provided in order to decrease the resistivity of the first electrode 1. It is placed in contact with the electrode layer 1b of the first electrode 1. Materials used for forming the auxiliary electrode 15 are preferably low resistive metals such as gold, platinum, silver, copper, and aluminum. Since these metals have a low light transmitting property, it is formed in a pattern within the region that will not affect the taking-out of emitted light h from the light taking-out surface 13a.

As a forming method of the auxiliary electrode 15, it can be cited: a vapor deposition method, a sputtering method, a printing method, an inkjet method and an aerosol jet method. A line width of the auxiliary electrode 15 is preferably 50 μm or less from the viewpoint of opening ratio of the light taking-out. A thickness of the auxiliary electrode 15 is preferably 1 μm or more from the viewpoint of conductivity.

<Sealing Material>

A sealing material 17 covers the organic EL element 10. It may be a plate type (a film type) sealing material that is fixed to the side of the substrate 13 through an adhesive 19, or it may be a sealing film. The sealing material 17 is placed in a condition of covering at least the organic functional layers 3, with exposing edge portions of the first electrode 1 and the second electrode 5a of the organic EL element 10. It may be constituted in a manner that an electrode is provided to the sealing material 17 so that the electrode and edge portions of the first electrode 1 and the second electrode 5a of the organic EL element 10t are made in a conduction state.

As a plate type (or film type) sealing material 17, specifically listed are a glass substrate, a polymer substrate, and a metal substrate. These substrates may be used in a thinner film shape. Examples of a glass substrate include: soda-lime glass, barium-strontium containing glass, lead glass, aluminosilicate glass, borosilicate glass, barium borosilicate glass, and quartz. Further, examples of a polymer substrate include: polycarbonate, acryl, polyethylene terephthalate, polyether sulfide, and polysulfone. A metal substrate includes one made of a metal selecting from the group consisting of stainless steel, iron, copper, aluminum, magnesium, nickel, zinc, chromium, titanium, molybdenum, silicon, germanium, and tantalum, or an alloy thereof.

Among them, since it is possible to make an element in a thin film, a polymer substrate or a metal substrate in a thin film state is preferably used as a sealing material 17.

Further, an oxygen permeability of the film state polymer substrate is preferably $1 \times 10^{-3}$ ml/(m$^2 \cdot$24 h·atm) or less determined by the method based on JIS K 7126-1987, and a water vapor permeability thereof is preferably $1 \times 10^{-3}$ g/(m$^2 \cdot$24 h) or less (at 25±0.5° C., relative humidity: 90±2% RH) determined by the method based on JIS K 7129-1992.

The above-described substrate materials may be used for the sealing material 17 after converting them into a concave shape. Conversion of the sealing material into a concave shape is carried out employing a sand blast process or a chemical etching process.

An adhesive 19 used for fixing the plate type sealing material 17 to the substrate 13 is employed as a sealing agent to seal the organic EL element 10 that is interposed between sealing material 17 and the substrate 13. Specific examples of an adhesive 19 are: a photo-curing and heat-curing type adhesive having a reactive vinyl group such as an acrylic acid based oligomer and a methacrylic acid based oligomer; a moisture curing type adhesive such as 2-cyanoacrylates.

A further example of an adhesive 19 is a thermal and chemical curing type (two liquid mixing type) such as an epoxy based adhesive. Further, it can be listed hot-melt type polyamide, polyester, and polyolefin. Moreover, it can be listed a cationically curable type UV curable epoxy resin adhesive.

In addition, since the organic materials constituting the organic EL element 10 are occasionally deteriorated via a thermal process, the adhesive 19 is preferably a material which enables adhesion and curing between room temperature and 80° C. Further, a desiccating agent may be dispersed into the adhesive.

The adhesive 19 may be applied onto a sealing portion of the plate type sealing material 17 and the substrate 13 via a commercial dispenser, or may be printed thereon in the same manner as a screen printing.

When a space is formed between the sealing material 17, the substrate 13, and adhesive 19, it is preferable to inject an inert gas such as nitrogen or argon, or an inert liquid such as a fluorinated hydrocarbon or a silicon oil in the space. It may be made to a vacuum state. Further, a hygroscopic compound may be enclosed in the space Examples of a hygroscopic compound include: metal oxides (for example, sodium oxide, potassium oxide, calcium oxide, barium oxide, magnesium oxide, and aluminum oxide); sulfates (for example, sodium sulfate, calcium sulfate, magnesium sulfate, and cobalt sulfate); metal halides (for example, calcium chloride, magnesium chloride, cesium fluoride, tantalum fluoride, cerium bromide, magnesium bromide, barium iodide, and magnesium iodide); perchlorates (for example, barium perchlorate and magnesium perchlorate). With respect to sulfates, metal halides, and perchlorates, anhydrides are suitably employed.

On the other hand, when a sealing film used as a sealing material 17, the sealing film is used for fully covering the organic functional layers 3 of the organic EL element 10, and at the same time, it covers the substrate 13 with a condition that the edge portions of the first electrode 1 and the second electrode 5a of the organic EL element 10 are exposed.

The sealing film is composed of an inorganic material or an organic material. In particular, it is composed of a material having a function of preventing the penetration of the substance which induces deterioration of the organic functional layers 3 of the organic EL element 10. Examples of the material are inorganic materials such as silicon oxide, silicon dioxide, and silicon nitride. Further, in order to improve brittleness of the sealing film, it may be formed a laminated structure by using a film made of an organic material in addition to the film made of an inorganic material.

The forming methods of these film are not particularly limited, and examples of employable methods include a vacuum deposition method, a sputtering method, a reactive sputtering method, a molecular beam epitaxy method, a cluster ion beam method, an ion plating method, a plasma polymerization method, a plasma CVD method, a laser CVD method, a thermal CVD method, and a coating method.

<Protective Film and Protective Plate>

A protective film or a protective plate (not illustrated in the figure) may be provided by interposing the substrate 13, the organic EL element 10, and the sealing material 17. This protective film or protective plate may be arranged to enhance the mechanical strength of the organic EL element 10. Specifically, when the sealing material 17 is achieved via the sealing film, the resulting mechanical strength of the organic EL element 10 is not always high enough. In this case, it is preferable to arrange the protective film or the protective plate.

Usable materials for the protective film or the protective plate include: a glass plate, a polymer plate, a polymer film thinner than the polymer plate, a metal plate, a metal film thinner than the metal plate, a polymer material film, or a metal material film. Among these, in terms of light weight and a decrease in thickness of the element, it is preferable to employ a polymer film.

EXAMPLES

The present invention will now be described with reference to examples, however, the present invention is not limited thereto.

Example 1

<Production of Organic EL Element 101>
<Production of Organic EL Element 101 Having a Light-emitting Pattern>

A nitrogen containing compound N-1 having the following structure was deposited as a film of 25 μm on a transparent substrate of a PET film of 75 μm thickness (Cosmo Shine A4300, made by TOYOBO Co. Ltd.) in a vacuum deposition apparatus, the transparent substrate being provided with a gas barrier layer laminated with a polysilazane layer and an organic layer (stress releasing layer). Subsequently, a cathode made of silver as a film of 10 nm thickness was formed by using a mask. Here, the gas barrier layer on the transparent substrate was formed in the same manner as formation of the gas barrier film sample 1 in Example 1 of JP-A No. 2012-599.

Subsequently, in heating boats for vapor deposition each were placed an optimum amount of material for producing an each element: CuPC (copper phthalocyanine) as a hole injection material, α-NPD as a hole transport material, DPVBi as a host compound in a blue emitting layer, FIr(pic) as a dopant in the blue emitting layer, CBP as host compound in a green emitting layer, Ir(ppy)$_3$ as a dopant in the green emitting layer, Alq$_3$ as a dopant in a red emitting layer, BAlq as a hole blocking layer, and LiF as an electron injection material.

The structures of N-1, CuPC, α-NPD, DPVBi, FIr(pic), CBP, Ir(ppy)$_3$, Ir(piq)$_3$, BAlq, and Alq$_3$ are shown in the following.

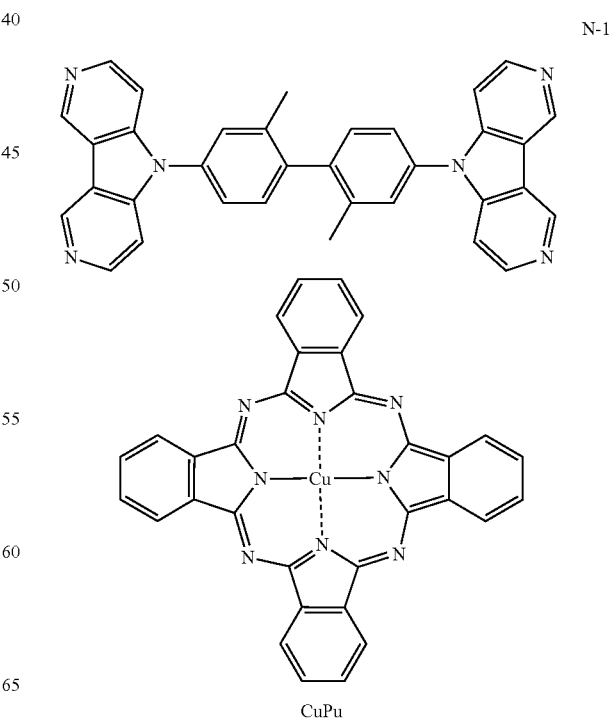

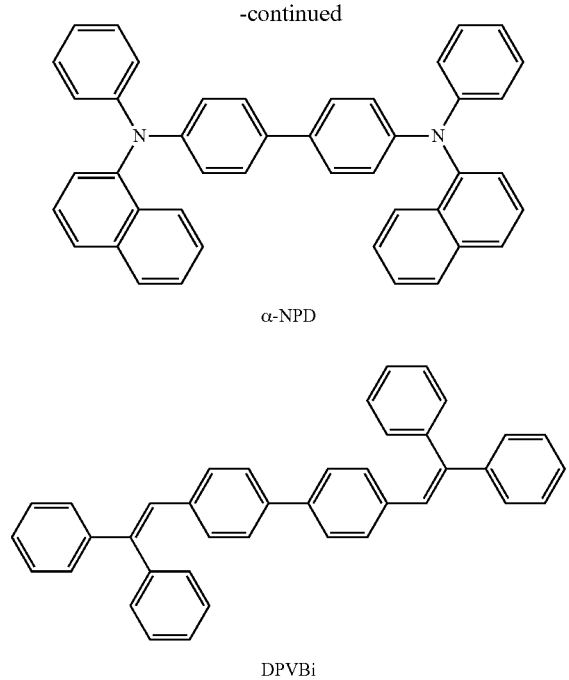

α-NPD

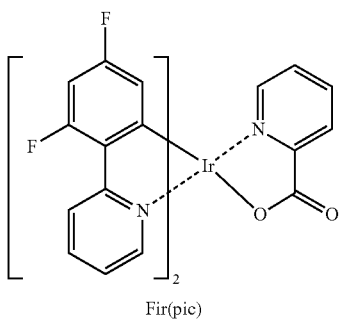

DPVBi

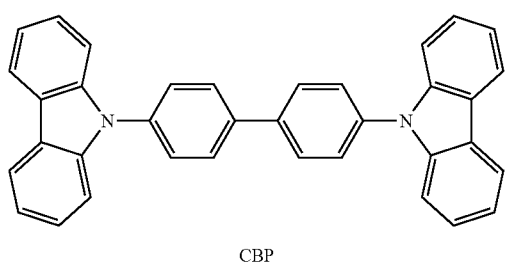

Fir(pic)

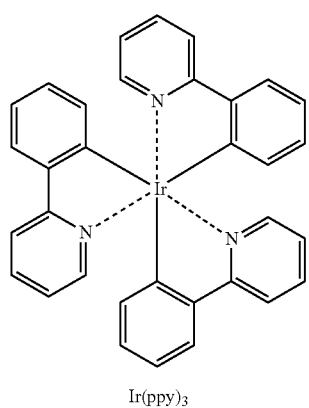

CBP

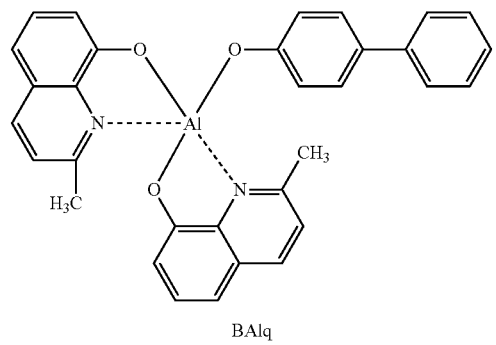

Ir(ppy)₃

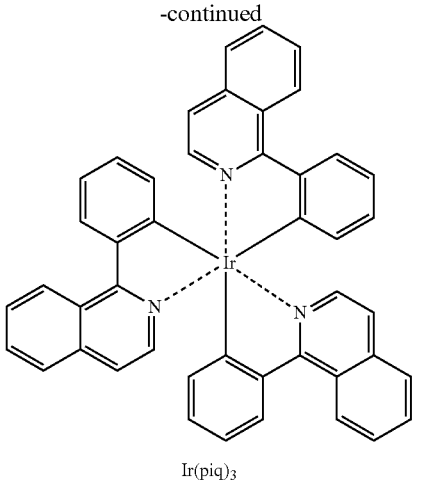

Ir(piq)₃

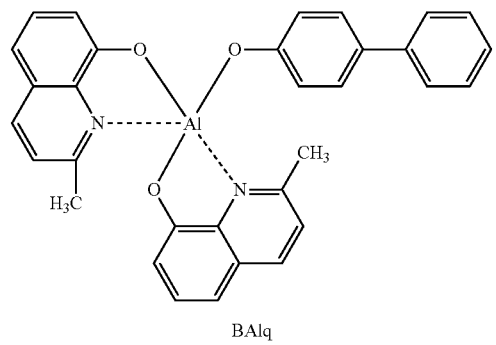

BAlq

Alq₃

Subsequently, after reducing the pressure of the vacuum tank to $4 \times 10^{-4}$ Pa, the heating boat containing CuPC was heated via application of electric current, and CuPC was deposited on the ITO electrode side of the transparent substrate at a deposition rate of 0.1 nm/sec, whereby it was produced a hole injection layer having a thickness of 15 nm.

Subsequently, the heating boat containing α-NPD was heated via application of electric current, and α-NPD was deposited on the hole injection layer at a deposition rate of 0.1 nm/sec, whereby it was produced a hole transport layer having a thickness of 25 nm.

Subsequently, the heating boat containing 3 mass % of FIr(pic) and DPVBi was heated via application of electric current, and FIr(pic) and DPVBi were co-deposited on the hole transport layer at a total co-deposition rate of 0.1 nm/sec, whereby it was produced a blue emitting layer having a thickness of 15 nm.

Subsequently, the heating boat containing CBP was heated via application of electric current, and CBP was deposited on the blue emitting layer at a deposition rate of 0.1 nm/sec, whereby it was produced a first intermediate layer having a thickness of 5 nm.

Subsequently, the heating boat containing 5 mass % of Ir(ppy)$_3$ and CBP was heated via application of electric current, and Ir(ppy)$_3$ and CBP were co-deposited on the first intermediate layer at a total co-deposition rate of 0.1 nm/sec, whereby it was produced a green emitting layer having a thickness of 10 nm.

Subsequently, the heating boat containing CBP was heated via application of electric current, and CBP was deposited on the green emitting layer at a deposition rate of 0.1 nm/sec, whereby it was produced a second intermediate layer having a thickness of 5 nm.

Subsequently, the heating boat containing 8 mass % of Ir(piq)$_3$ and CBP was heated via application of electric current, and Ir(piq)$_3$ and CBP were co-deposited on the second intermediate layer at a total co-deposition rate of 0.1 nm/sec, whereby it was produced a red emitting layer having a thickness of 10 nm.

Subsequently, the heating boat containing BAlq was heated via application of electric current, and BAlq was deposited on the red emitting layer at a deposition rate of 0.1 nm/sec, whereby it was produced a hole blocking layer having a thickness of 15 nm.

Subsequently, the heating boat containing Alq$_3$ was heated via application of electric current, and Alq$_3$ was deposited on the hole blocking layer at a deposition rate of 0.1 nm/sec, whereby it was produced an electron transport layer having a thickness of 30 nm.

Further, the heating boat containing LiF was heated via application of electric current, and LiF was deposited on the electron transport layer at a deposition rate of 0.1 nm/sec, whereby it was produced an electron injection layer having a thickness of 1 nm. Thus, organic functional layers were formed.

In the end, aluminum was vapor deposited on the electron injection layer to form a cathode having a thickness of 110 nm. Thus, an organic EL element was produced.

The vapor deposited surface was covered with an epoxy resin having a thickness of 300 μm to form a sealing material. Moreover, it was covered with an aluminum foil having a thickness of 12 μm to form a protective film, and then, it was cured. All of the processes to this stage were done in a glove box under a nitrogen atmosphere (a high purity nitrogen gas atmosphere with purity of 99.999% or more) without exposing the element to the air.

On the surface of resin substrate opposite to the surface on which the above-described layers are placed a pattern mask and a UV absorbing filter (Isuzu Glass Inc.), and they were closely adhered with a reduced pressure. The, UV rays were irradiated from the resin substrate side for 3 hours using UV Tester (SUV-W151: 100 mW/cm$^2$, made by Iwasaki Electric Co. Ltd.) to make a patterning.

The UV absorbing filter having a light transmittance of 50% or less in the wavelength component of 320 nm or less was employed (cut wavelength: 320 nm). Thus, an organic EL element 101 was produced.

<Production of Organic EL Element 4 Having a Light-emitting Pattern>

The light-emitting region having a size of 93×93 mm of the produced organic EL element 101 was irradiated with changing an amount of light of UV Tester (SUV-W151: 100 mW/cm$^2$, made by Iwasaki Electric Co. Ltd.) using a scale having steps of a different density. The light-emitting luminance of the scale having steps of a different density was measured with 2D Color Analyzer CA-2000 made by Konica Minolta, Inc. It was obtained a calibration curve which shows a relationship between the relative amount of the light irradiation given to the organic EL element and the light-emitting luminance after performing patterning to the organic EL element.

Next, on the premise of observing an image in sRGB color space, by using a person image having RGB signals each having 8 bits, the image signals were converted.

At first, the signal values were converted to a tristimulus Y according to the standard defined in IEC 61966-2-1. By using a common logarithm value of the tristimulus Y, the relationship between the signal values of the original image and brightness was determined.

Subsequently, an exposure amount is read from the calibration curve so that log $Y_A$ (which is derived from the signal value A of the original image) will give a light-emitting luminance determined based on a tone reproduction curve having a softer gradation section with a smaller slope in the highlight portion and in the shadow portion than a slope of a gradation of the straight line portion and having a characteristic of OLED 4 in Table 1. The digital data B that gives this exposure amount is determined. Thus, the digital data A is converted to the digital data B. This process was done to all of the data to obtain a conversion table (LUT). At this time, it was made that an amount of emitted light of the organic EL element was maximum when the tristimulus value was 100 (log Y=2) to avoid loss of information in the highlight section. At the same time, the relative amount of the light irradiation and the tristimulus value Y were correlated.

Thus, based on the converted data obtained from original signal values, pattering was carried out by irradiation with UV rays under the same conditions as producing the calibration curve. Thus, an organic EL element 4 was produced.
<Production of Organic EL Elements 5 to 7 Having a Light-emitting Pattern>

In the same manner as production of the organic EL element 4, organic EL Elements 5 to 7 having a light-emitting pattern were produced by performing pattering using a tone reproduction curve having a characteristic as shown in Table 1. With respect to the straight line portion, the straight line portion of the tone reproduction curve was changed so that the variation was made to be the same as indicated in the table. And patterning was performed.

straight line portion. Thus, the magnitude of the variation was indicated.

In Table 1, (*1) indicates that the contrast ratio of the maximum light-emitting luminance to the minimum light-emitting luminance was small, and there was no straight line portion of the present invention.

The gradation of the produced organic EL element having a light-emitting pattern was confirmed to be the light-emitting pattern having the same gradation as the tone reproduction curve made in advance.

TABLE 1

| | No. | | OLED1 | OLED2 | OLED3 | OLED4 | OLED5 | OLED6 | OLED7 |
|---|---|---|---|---|---|---|---|---|---|
| *1 | Variation in the straight line portion (Relative value) | Maximum (%) | *1 | 150 | 85 | 48 | 38 | 35 | 22 |
| | | Minimum (%) | *1 | −145 | −100 | −45 | −42 | −36 | −23 |
| | $\gamma_L$ of the straight line portion | | *1 | 0.20 | 2.50 | 0.60 | 0.90 | 1.80 | 0.90 |
| | $\gamma_H$ of the highlight portion | | *1 | 0.30 | 3.00 | 0.44 | 0.60 | 1.30 | 0.55 |
| | $\gamma_S$ of the shadow portion | | *1 | 0.20 | 2.40 | 0.40 | 0.65 | 1.30 | 0.58 |
| | Maximum light-emitting luminance(cd/m$^2$) | | 300 | 500 | 1000 | 1000 | 1000 | 1000 | 1000 |
| | Minimum light-emitting luminance(cd/m$^2$) | | 200 | 100 | 150 | 100 | 80 | 40 | 40 |
| | Contrast | | 1.5 | 5 | 6.7 | 10 | 12.5 | 25 | 25 |
| Remarks | | | | *2 | *2 | *2 | *3 | *3 | *3 | *3 |

*1: Tone reproduction curve
*2: Comparative example
*3: Inventive example

<Production of Organic EL Elements 1 to 3 Having a Light-emitting Pattern>

An organic EL element 1 was produced only by reversing the contrast of the RGB data without conducting the gradation adjustment based on the tone reproduction curve.

In the same manner as production of the organic EL element 4, comparative organic EL elements 2 and 3 having a light-emitting pattern were produced by performing pattering using a tone reproduction curve having a characteristic as shown in Table 1. In addition, in the following examples, an organic EL element having a light-emitting pattern is abbreviated as OLED.

Table 1 shows: presence or absence of a straight line portion in a tone reproduction curve used in Example 1, $\gamma_L$ of the straight line portion, $\gamma_H$ of the highlight portion, $\gamma_S$ of the shadow portion, maximum value of light-emitting luminance, minimum value of light-emitting luminance, and contrast. The slope of gradation was measured at every 0.1 logarithm unit in the horizontal axis of the tone reproduction curve. The maximum variation thereof was calculated as a relative value (±%) with respect to an arithmetic average of Examiners of 10 persons observed the emitted images from OLED1 to 7 having a patterned person image and made subjective evaluation. A rank "1" was given to an emitted image showing an undesirable tone reproduction. A rank "5" was given to an emitted image showing a desirable tone reproduction. A 5 grade evaluation was conducted. Average rankings made by the examiners of 10 persons are shown in Table 2.

TABLE 2

| No. | OLED1 | OLED2 | OLED3 | OLED4 | OLED5 | OLED6 | OLED7 |
|---|---|---|---|---|---|---|---|
| Average evaluation ranking | 1.0 | 1.5 | 2 | 3.5 | 4 | 4.2 | 4.8 |
| Remarks | *1 | *1 | *1 | *2 | *2 | *2 | *2 |

*1: Comparative example
*2: Inventive example

From Table 2, it is understood that OLED 4 to 7 of the present invention are excellent in tone characteristic.

Example 2

By using the same organic EL elements and the manner as used in Example 1, on the premise of observing an image in sRGB color space, a scenic image was outputted.

Table 3 shows: presence or absence of a straight line portion in a tone reproduction curve used in Example 2, $\gamma_L$ of the straight line portion, $\gamma_H$ of the highlight portion, $\gamma_S$ of the shadow portion, maximum value of light-emitting luminance, minimum value of light-emitting luminance, and contrast.

<Production of Organic EL Elements 8 to 13 Having a Light-Emitting Pattern>

In the same manner as production of organic EL element 4 in Example 1, organic EL elements 8 to 13 having a light-emitting pattern were produced.

The gradation of the produced organic EL element having a light-emitting pattern was confirmed to be the light-emitting pattern having the same gradation as the tone reproduction curve made in advance.

10: Organic EL element
13: Substrate
13a: Light taking-out surface
15: Auxiliary electrode
16: Taking-out electrode
17: Sealing material
19: Adhesive
h: Emitted light
10: Organic EL element

TABLE 3

| | No. | | OLED8 | OLED9 | OLED10 | OLED11 | OLED12 | OLED13 |
|---|---|---|---|---|---|---|---|---|
| *1 | Variation in the straight line portion (Relative value) | Maximum (%) | 110 | 90 | 45 | 35 | 31 | 20 |
| | | Minimum (%) | −105 | −75 | −48 | −35 | −29 | −18 |
| | $\gamma_L$ of the straight line portion | | 0.20 | 2.50 | 0.60 | 0.90 | 1.80 | 1.50 |
| | $\gamma_H$ of the highlight portion | | 0.18 | 2.30 | 0.40 | 0.68 | 1.38 | 1.10 |
| | $\gamma_S$ of the shadow portion | | 0.22 | 2.55 | 0.42 | 0.70 | 1.39 | 1.15 |
| | Maximum light-emitting luminance(cd/m$^2$) | | 500 | 1000 | 1000 | 1000 | 1000 | 1000 |
| | Minimum light-emitting luminance(cd/m$^2$) | | 100 | 150 | 100 | 80 | 40 | 40 |
| | Contrast | | 5 | 6.7 | 10 | 12.5 | 25 | 25 |
| Remarks | | | *2 | *2 | *3 | *3 | *3 | *3 |

*1: Tone reproduction curve
*2: Comparative example
*3: Inventive example

In the same manner as in Example 1, examiners of 10 persons observed and made subjective evaluation. Average rankings are shown in Table 4.

TABLE 4

| No. | OLED8 | OLED9 | OLED10 | OLED11 | OLED12 | OLED13 |
|---|---|---|---|---|---|---|
| Average evaluation ranking | 1 | 1.5 | 3.5 | 4 | 4.2 | 4.8 |
| Remarks | *1 | *1 | *2 | *2 | *2 | *2 |

*1: Comparative example
*2: Inventive example

From Table 4, it is understood that OLED 10 to 13 of the present invention are excellent in tone characteristic.

INDUSTRIAL APPLICABILITY

By the production method of the organic electroluminescent element of the present invention, it is possible to provide a production method of an organic electroluminescent element provided with a light-emitting pattern having superior tone characteristic.

DESCRIPTION OF SYMBOLS

1: First electrode
1a: Underlayer
1b: Electrode layer
3: Organic functional layer
3a: Hole injection layer
3b: Hole transport layer
3c: Light-emitting layer
3d: Electron transport layer
3e: Electron injection layer
5a: Second electrode

The invention claimed is:

1. A method of producing an organic electroluminescent element having a light-emitting pattern, the organic electroluminescent element comprising one or a plurality of organic functional layers between at least a pair of electrodes,
the method comprising a step of:
forming the light-emitting pattern by light irradiation to the organic electroluminescent element with changing an amount of the light irradiation based on a tone reproduction curve made in advance which has a highlight portion, a shadow portion and a straight line portion, and the highlight portion and the shadow portion each having a soft gradation section with a smaller slope than a slope of a gradation of the straight line portion to result in forming the light-emitting pattern having a gradation by a light-emitting luminance corresponding to the amount of the light irradiation.

2. The method of producing an organic electroluminescent element having a light-emitting pattern described in claim 1, wherein the slope of the gradation of the straight line portion in the tone reproduction curve is in the range of 0.6 to 2.0.

3. The method of producing an organic electroluminescent element having a light-emitting pattern described in claim 1, wherein a ratio of a maximum light-emitting luminance to a minimum light-emitting luminance of the organic electroluminescent element is 10 or more.

4. The method of producing an organic electroluminescent element having a light-emitting pattern described in claim 1,
wherein the soft gradation section in the highlight portion of the tone reproduction curve is in the range of at least −0.20 in common logarithm unit of the light-emitting luminance (log(light-emitting luminance)) from a maximum light-emitting luminance of the organic electroluminescent element having a light-emitting pattern; and
the soft gradation section in the shadow portion is in the range of at least +0.20 in common logarithm unit of the light-emitting luminance (log(light-emitting luminance)) from a minimum light-emitting luminance of the organic electroluminescent element having a light-emitting pattern.

5. The method of producing an organic electroluminescent element having a light-emitting pattern described in any claim 1,
wherein the light-emitting pattern formed by the light irradiation is a light-emitting pattern formed by irradiation with light including UV rays.

\* \* \* \* \*